United States Patent
Holliman et al.

(10) Patent No.: US 8,455,295 B2
(45) Date of Patent: Jun. 4, 2013

(54) LOW TEMPERATURE SINTERING OF DYE-SENSITISED SOLAR CELLS

(75) Inventors: Peter Holliman, Conwy (GB); Arthur Connell, Gwynedd (GB)

(73) Assignee: Bangor University (GB)

( * ) Notice: Subject to any disclaimer, the term of this patent is extended or adjusted under 35 U.S.C. 154(b) by 0 days.

(21) Appl. No.: 13/260,448

(22) PCT Filed: Mar. 9, 2010

(86) PCT No.: PCT/EP2010/052953
§ 371 (c)(1),
(2), (4) Date: Dec. 15, 2011

(87) PCT Pub. No.: WO2010/130476
PCT Pub. Date: Nov. 18, 2010

(65) Prior Publication Data
US 2012/0115271 A1    May 10, 2012

(30) Foreign Application Priority Data
Mar. 26, 2009 (GB) .................... 0905082.4

(51) Int. Cl.
*H01L 21/00* (2006.01)
(52) U.S. Cl.
USPC .............. 438/85; 257/E25.009; 136/263
(58) Field of Classification Search
USPC .......... 438/57, 66, 85; 136/263; 257/E25.009
See application file for complete search history.

(56) References Cited

U.S. PATENT DOCUMENTS

| 7,431,903 | B2 | 10/2008 | Koyanagi | |
|---|---|---|---|---|
| 2003/0056821 | A1 | 3/2003 | Chittibabu | |
| 2003/0140959 | A1 | 7/2003 | Gaudiana | |
| 2006/0243321 | A1* | 11/2006 | Yamada et al. | 136/263 |
| 2006/0289057 | A1* | 12/2006 | Gonda et al. | 136/263 |
| 2007/0102040 | A1 | 5/2007 | Beckenbaugh | |

FOREIGN PATENT DOCUMENTS
EP    1858108 A1    11/2007

OTHER PUBLICATIONS

International Application Serial No. PCT/EP2010/052953, International Search Report mailed Jul. 26, 2010, 3 pgs.
O'Regan, Brian, "A low-cost, high-efficiency solar cell based on dye-sensitized colloidal TiO2 films", Nature, vol. 353, (Oct. 24, 1991), 737-739.
Perez-Munuzuri, V., "Super-spiral structures in an excitable medium", Nature vol. 353, (Oct. 24, 1991), 740.
Lewis, Larry N., "A novel UV-mediated low-temperature sintering of $TiO_2$ for dye-sensitized solar cells", Solar Energy Materials & Solar Cells 90, (2006), 1041-1051.

(Continued)

*Primary Examiner* — Brook Kebede
(74) *Attorney, Agent, or Firm* — RatnerPrestia

(57) ABSTRACT

The invention relates to the field of dye-sensitized solar cells and discloses a method for reducing the temperature necessary for sintering the metal oxide paste coating the electrode. The method comprises applying a colloid comprising a metal oxide, a solvent and a binder to an electrode and heating the coated electrode to a temperature of at most 300° C. for sintering the metal oxide following by cooling the electrode coated with sintered metal oxide. A process for preparing dye sensitized solar cells is also disclosed.

26 Claims, 1 Drawing Sheet

OTHER PUBLICATIONS

Murayama, Masaki, "Low-Temperature Fabrication of $TiO_2$ Necking Electrode by Sol-Gel Method and its Application to Dye-Sensitized Solar Cell", Japanese Journal of Applied Physics vol. 45, No. 10A. (2006), 7917-7921.

Fan, Shengqiang, "Influence of $TiCl_4$ treatment of performance of dye-sensitized solar cell assembled with nano-$TiO_4$ coating deposited by vacuum cold spraying", Rare Metals, vol. 25, (Oct. 2006), 163-168.

* cited by examiner

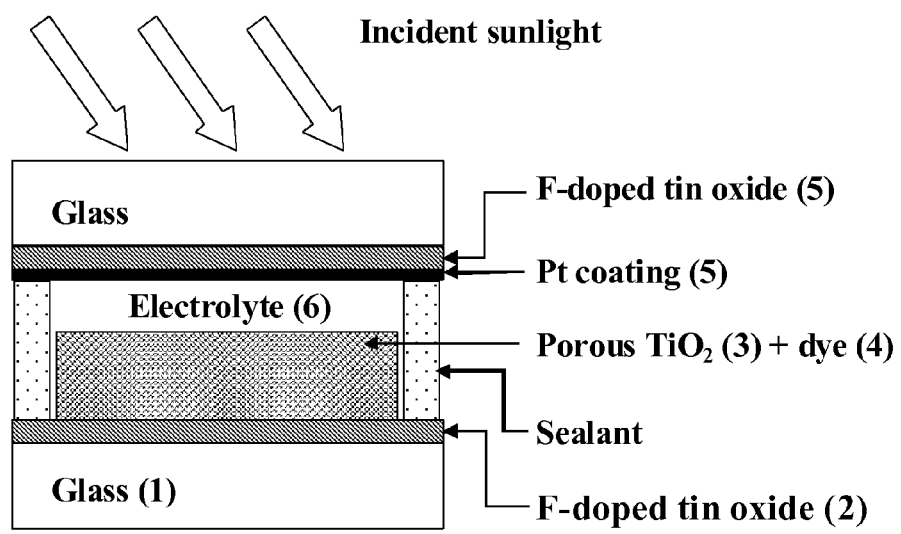

LOW TEMPERATURE SINTERING OF DYE-SENSITISED SOLAR CELLS

CROSS REFERENCE TO RELATED APPLICATIONS

This application is the U.S. national phase under 35 U.S.C. §371 of International Application No. PCT/EP2010/052953, filed Mar. 9, 2010, and claims priority to GB Patent Application No. 0905082.4, filed Mar. 26, 2009, the contents of each of which are incorporated by reference in their entireties.

BACKGROUND OF THE INVENTION

1. Field of the Invention

This invention relates to the field of dye-sensitised solar cells and to a method for reducing the temperature necessary for sintering the metal oxide paste coating the electrode.

2. Description of the Related Art

Solar cells are traditionally prepared using solid state semiconductors. Cells are prepared by juxtaposing two doped crystals, one with a slightly negative charge, thus having additional free electrons (n-type semiconductor) and the other with a slightly positive charge, thus lacking free electrons (p-type semiconductor). When these two doped crystals are put into contact with each other, extra electrons from the n-type semiconductor flow through the n-p junction to reduce the lack of electrons in the p-type semiconductor. At the p-n junction, charge carriers are depleted on one side and accumulated on the other side thereby producing a potential barrier. When photons produced by sunlight strike the p-type semiconductor, they induce transfer of electrons bound in the low energy levels to the conduction band where they are free to move. A load is placed across the cell in order to transfer electrons, through an external circuit, from the p-type to the n-type semiconductor. The electrons then move spontaneously to the p-type material, back to the low energy level they had been extracted from by solar energy. This motion creates an electrical current.

Typical solar cell crystals are prepared from silicon because photons having frequencies in the visible light range have enough energy to take electrons across the band-gap between the low energy levels and the conduction band. One of the major drawbacks of these solar cells is that the most energetic photons in the violet or ultra-violet frequencies have more energy than necessary to move electrons across the band-gap, resulting in considerable waste of energy that is merely transformed into heat. Another important drawback is that the p-type layer must be sufficiently thick in order to have a chance to capture a photon, with the consequence that the freshly extracted electrons also have a chance to recombine with the created holes before reaching the p-n junction. The maximum reported efficiencies of the silicon-type solar cells are thus of 20 to 25% or lower for solar cell modules, due to losses in combining individual cells together.

Another important problem of the silicon-type solar cell is the cost in terms of monetary price and also in terms of embodied energy, that is the energy required to manufacture the devices. Dye-sensitised solar cells (DSSC) have been developed in 1991 by O'Regan and Gratzel (O'Regan B. and Gratzel M., in Nature, 1991, 353, 737-740). They are produced using low cost material and do not require complex equipment for their manufacture. They separate the two functions provided by silicon: the bulk of the semiconductor is used for charge transport and the photoelectrons originate from a separate photosensitive dye. The cells are sandwich structures as represented in FIG. 1 and are typically prepared by the steps of:

a) providing a transparent plate (1) typically prepared from glass;
b) coating this plate with a transparent conducting oxide (TCO) (2), preferably with doped tin oxide;
c) applying a paste of metal oxide (3), generally titanium dioxide, to the coated glass plate on the TCO side;
d) heating the plate to a temperature of about 450° C. to 600° C. for a period of time of at least one hour;
e) soaking the coated plate of step d) in a dye solution for a period of time of about 24 hours in order to covalently bind the dye to the surface of the titanium dioxide (4);
f) providing another TCO coated transparent plate further coated with platinum (5);
g) sealing the two glass plates and introducing an electrolyte solution (6) between said plates in order to encase the dyed metal oxide and electrolyte between the two conducting plates and to prevent the electrolyte from leaking.

In these cells, photons strike the dye moving it to an excited state capable of injecting electrons into the conducting band of the titanium dioxide from where they diffuse to the anode. The electrons lost from the dye/$TiO_2$ system are replaced by oxidising the iodide into triiodide at the counter electrode, whose reaction is sufficiently fast to enable the photochemical cycle to continue.

The DSSC generate a maximum voltage comparable to that of the silicon solar cells, of the order of 0.7 V. An important advantage of the DSSC, as compared to the silicon solar cells, is that they inject electrons in the titanium dioxide conduction band without creating electron vacancies nearby, thereby preventing quick electron/hole recombinations. They are therefore able to function in low light conditions where the electron/hole recombination becomes the dominant mechanism in the silicon solar cells. The present DSSC are however not very efficient in the lower part of the visible light frequency range in the red and infrared region, because these photons do not have enough energy to cross the titanium dioxide band-gap or to excite most traditional ruthenium bipyridyl dyes.

A major disadvantage of the DSSC resides in the high temperature necessary for sintering the metal oxide paste. Another drawback of the dye-sensitised solar cells lies in the long time necessary to dye the titanium dioxide nanoparticles: it takes between 12 and 24 hours to dye the layer of titanium dioxide necessary for solar cell applications. Another major difficulty with the DSSC is the electrolyte solution: the cells must be carefully sealed in order to prevent liquid electrolyte leakage and therefore cell deterioration.

There is thus a need to prepare robust solar cells that can be prepared rapidly at reduced cost.

SUMMARY OF THE INVENTION

It is an aim of the present invention to reduce the temperature necessary for sintering the metal oxide paste coating the electrode of dye-sensitised solar cells.

It is an aim of the present invention to ensure good adhesion both within the metal oxide film and between the metal oxide film and the substrate.

It is also an aim of the present invention to use thermal and/or ultra-violet and/or microwave energy for the sintering process.

It is a further aim of the present invention to increase the porosity of the metal oxide paste.

It is yet a further object of the present invention to prepare solar cells having an efficiency of at least 4%.

In accordance with the present invention, the foregoing aims are realised as defined in the independent claims. Preferred embodiments are defined in the dependent claims.

BRIEF DESCRIPTION OF THE DRAWINGS

FIG. 1 is a schematic representation of a dye-sensitised solar cell.

DESCRIPTION OF THE PREFERRED EMBODIMENTS

Accordingly, the present invention discloses a method for low temperature sintering of metal oxide paste coating the electrode of dye-sensitised solar cells.

The method comprises the steps of:
a) providing an electrode prepared from an electro-conducting substrate;
b) optionally pre-treating the electro-conducting substrate to ensure good adhesion of the metal oxide film.
c) preparing a colloid comprising at least one metal oxide, a solvent, optionally an adhesion agent and at least one binder;
d) adding from more than zero wt % up to 20 wt %, based on the weight of the metal oxide, of a thermal catalyst and/or adhesion agent to the colloid of step c);
e) applying the composition of step d) to the electrode;
f) heating the coated electrode to a temperature of at most 300° C. for sintering the metal oxide followed by cooling to a temperature of about 100° C.;
g) optionally post-treating the metal oxide film with $TiCl_4$ solution and re-sintering to a temperature of at most, 300° C., followed by cooling to a temperature of about 100° C.;
h) retrieving the electrode coated with sintered metal oxide.

Sintering is an important step in the preparation of the dye-sensitised solar cells. It ensures that the metal oxide particles adhere to each other thereby efficiently carrying current and that they adhere strongly to the electrode substrate. Sintering also ensures complete removal of the organic binder and solvent present in the metal oxide colloid paste thereby increasing the porosity of the metal oxide film. It also helps to prepare the metal oxide surface for successful dye sensitization. Metal oxide colloids are also used to apply metal oxide to the electro-conducting substrate by screen-printing or doctor blading techniques to ensure that the film does not collapse after application.

The metal oxide colloid is a paste of nanoparticles preferably prepared from a colloidal solution of metal oxide. The electronic contact between the particles is produced by sintering. Said sintering was typically carried out in the prior art by thermal treatment at a temperature of 450° C. to 600° C. for a period of time of at least 30 minutes. In the present invention, a pre-treatment step is included to improve adhesion of the metal oxide film to the electro-conducting substrate. Sintering is then carried out at a temperature of at most 300° C., preferably of at most 290° C. The thermal treatment is followed by cooling, down to a temperature between room temperature and a temperature of about 120° C. The metal oxide film is then ready for dyeing. This can be optionally followed by a post-treatment step whereby the metal oxide film is exposed to a solution of $TiCl_4$ followed by re-sintering at a temperature of at most 300° C., preferably of at most 290° C. followed by cooling as in the previous treatment. Such additional treatment is preferably present because it can improve the efficiency of the solar cell. The size of the particles and pores making up the film is determined by the metal oxide particles' size and by the choice of binder and solvent used in the colloidal solution and also the ratio of oxide:binder:solvent. The internal surface of the film is an important parameter, also determined by the particles' size and by the film's thickness. The best combination of parameters depends upon the nature of the components used in the mixture and therefore upon the viscosity of the paste. Ideally, the viscosity is selected to allow the metal oxide film to be tipped without running but is sufficient to be doctor bladed or screen printed. The pore size must be large enough to allow easy diffusion and percolation of the electrolyte. The metal oxide particle sizes preferably range from 10 nm 30 nm, preferably from 12 nm 20 nm. The film thickness ranges from 5 μm to 20 μm, preferably from 7 μm to 15 μm. For example, in order to arrive at a final selected metal oxide thickness of about 10 μm, a paste layer of about 50 μm is spread on the electrode. It is then allowed to dry and is reduced to a thickness of about 40 μm. This is followed by a heat treatment that further reduces the thickness to 20 μm, half of which is titanium dioxide, thus a thickness of 10 μm, and the other half is porosity. The amount of titanium dioxide in the composition is thus of 20 wt % based on the total weight of the paste.

The solvent mixed with the metal oxide paste can be selected from alcohols such as ethanol or propanol or terpineol. Preferably it is terpineol. Solvent such as terpineol is added in an amount of at least 200 wt %, preferably at least 300 wt %, up to 400 wt %, most preferably about 350 wt %, based on the weight of the metal oxide. Typically, ethanol may also optionally be added in an amount of at least 60 wt %, preferably at least 70 wt %, up to 80 wt %, most preferably 75 wt %, based on the weight of the metal oxide. The addition of ethanol improves mixing. The metal oxide paste is very viscous and cannot be stirred easily. The added ethanol is removed at the end of the process.

Typically, water is also added in an amount of at least 20 wt %, preferably at least 30 wt %, up to 40 wt %, most preferably 35 wt %, based on the weight of the metal oxide. The ethanol and water are removed after mixing by heating to a temperature of up to 100° C. under a vacuum of about $10^{-2}$ mm Hg.

The binder mixed with the metal oxide paste can be selected from long chain polymers such as ethyl cellulose or polyethylene glycol or polyvinyl alcohol.

The solvent and binder are added to the metal oxide and the mixture is stirred for several hours, homogenised for several minutes and sonicated for several minutes at room temperature to ensure homogeneous mixing of all components.

Low temperature sintering is achieved by first adding a binder to the colloid solution of metal oxide and solvent. The binder is a long chain polymer selected for example from polyethylene glycol, polyvinyl alcohol or ethyl cellulose, preferably it is ethyl cellulose. The binder serves several purposes. It stabilises and thickens the colloid solution thereby preventing it from collapsing and running when it is spread on the electrode. It also helps to provide porosity to the metal oxide paste, thereby favouring and improving percolation of the dye through the metal oxide paste. It is added in an amount of at least 20 wt %, preferably at least 30 wt %, up to 40 wt %, most preferably about 32 wt %, based on the weight of the metal oxide. Most typically titanium dioxide particles are used to form the metal oxide films because this material gives the highest recorded efficiencies in DSSC devices. In prior art conditions, titanium dioxide requires sintering temperatures of 450° C. to 600° C. to successfully remove binder material and sinter the metal oxide particles together. Other metal oxides can be used such as ZnO but the resulting DSC devices give lower DSC device efficiencies.

In addition to the sintering process, the thermal treatment serves the double purpose of evaporating the solvent and combusting the binder which, being a long polymer chain, is not volatile. It is essential that both solvent and binder are removed during sintering to produce a "clean" metal oxide surface for dyeing. If carbonaceous material remains within the metal oxide film, insufficient dye is adsorbed by the metal oxide film and poor dye sensitised solar cell device efficiency results.

The thermal catalyst mixed with the mineral oxide is another oxide selected from manganese oxide, vanadium oxide, barium oxide, niobium oxide or cerium oxide. It is added in an amount of more than zero, preferably at least 1 wt %, more preferably at least 5 wt % and up to 20 wt %, preferably up to 15 wt %, and more preferably up to 10 wt %, based on the weight of the metal oxide. The thermal catalyst operates during the heating taking place during the sintering cycle. This heating is carried out by exposing the film to energy such as radiant heating and/or UV visible light and/or microwave heating. Before heating, the unsintered film contains solvent, and polymeric binder which need to be removed along with non-combustible and non-volatile components such as metal oxide semiconductor, thermal catalyst and adhesion agent. With a typical heating rate of 20° C. min$^{-1}$ in the absence of thermal catalyst, solvent is lost through evaporation between room temperature and a temperature of approximately 120° C. The polymeric binder is lost through combustion between temperatures of 200° C. and 450° C. The addition of the thermal catalyst does not affect the loss of solvent by evaporation but rather enables the binder combustion to occur at a lower temperature by acting as an oxidation catalyst thereby lowering the activation energy of the combustion reaction, providing a reaction surface on which combustion can occur and acting as a localised oxygen source for combustion to occur.

In an alternative process, a precursor of the thermal catalyst is added to a precursor of the metal oxide semiconductor during its synthesis by the sol gel method, followed by hydrothermal treatment to enhance the crystallinity of the oxide material. Precursors for the thermal catalysts can include for example manganese acetate or manganese acetylacetonate for manganese oxide, niobium ethoxide for niobium oxide, vanadyl acetylacetonate or vanadyl oxytriiospropoxide for vanadium oxide, barium acetate or barium isopropoxide for barium oxide or ammonium cerium nitrate or cerium isopropoxide for cerium oxide. For the metal oxide semiconductor, the precursor is typically titanium isopropoxide for titanium dioxide and, the precursor is typically zinc nitrate or zinc acetate for zinc oxide. The resultant mixed-metal oxide is then prepared into a colloidal paste and applied to the substrate and sintered as described above. This sintering step can be followed by treatment with $TiCl_4$ solution and re-sintering as described above.

In yet another process, the thermal catalyst is added to the metal oxide semiconductor by a process of wet impregnation. Precursor agents for wet impregnation of the thermal catalysts can include for example manganese acetate or manganese acetylacetonate for manganese oxide, niobium ethoxide for niobium oxide, vanadyl acetylacetonate or vanadyl oxytriiospropoxide for vanadium oxide, barium acetate or barium isopropoxide for barium oxide or ammonium cerium nitrate or cerium isopropoxide for cerium oxide. The resultant metal oxide is then prepared into a colloidal paste and applied to the substrate and sintered as described above. This sintering step can be followed by treatment with $TiCl_4$ solution and re-sintering as described above.

The adhesion agent can include calcium oxide or calcium hydroxide or polyvinyl alcohol and/or a flocculating agent such as polyacrylamide or polyacrylic acid. The adhesion agent is added to aid the adhesion of titania particles to each other within the film but also to aid adhesion of the titania nanoparticles to the electro-conducting substrate. The adhesion agent is preferably added to the paste. If present, the sintering temperature can be further reduced without reducing the adhesion of metal oxide particles to one another and to the substrate.

The sintering time is between 30 minutes to 1 hour. Increasing the sintering time can further decrease the sintering temperature or vice versa.

Other than the reduction of sintering temperature, the binder, adhesion agent and thermal catalyst have an effect on the final coated electrode. It ensures the production of a film of metal oxide nanoparticles which is of uniform thickness, said thickness being determined by the paste contents and the thickness of the spacer used during application. It also provides homogeneous coverage over the substrate surface and a porosity of up to 50% of the film volume.

In another embodiment according to the present invention, after application of the colloid, the metal oxide film is first sintered at a temperature of 200° C. for 30 mins and then exposed to ultra-violet radiation for up to least 24 hours. This can be followed by treatment with $TiCl_4$:THF solution followed by re-sintering at a temperature of 200° C. for 30 minutes. After this, the film is ready for dyeing.

In an alternative process, after application of the colloid, the metal oxide film is first exposed to ultra-violet radiation for up to 24 hours and sintered at a temperature of 200° C. for 30 minutes. This can be followed by treatment with $TiCl_4$:THF solution followed by re-sintering at a temperature of 200° C. for 30 minutes. After this, the film is ready for dyeing.

In yet an alternative process, after application of the colloid, the metal oxide film can be sintered at temperatures up to 200° C., treated with water and then exposed to microwave radiation for up to one hour. This can be followed by treatment with $TiCl_4$:THF solution followed by re-sintering at a temperature of 200° C. for 30 minutes. After this, the film is ready for dyeing. The microwave can be any commercial or conventional microwave, the commercial being preferred because it delivers a constant radiation. The power ranges between 600 and 1000 watts, preferably it is of about 800 watts.

In an alternative process, the metal oxide film can be exposed to microwave radiation before heat sintering at a temperature of up to 200° C. and treatment with $TiCl_4$ solution followed by re-sintering at a temperature of up to 200° C. ready for dyeing.

Dye-sensitised solar cells are then prepared according to any method known in the art. Preferably they are prepared according to a fast-dyeing method described in co-pending patent application EP-09 152 316.7.

According to that method, dye-sensitised solar cells are prepared by the steps of:
a) providing a first electrode prepared from an electro-conducting substrate;
b) preparing a colloid comprising:
    A) either (i) at least one semiconducting metal oxide selected from titanium dioxide or zinc oxide or (ii) at least one semiconducting metal oxide and a thermal catalyst, or (iii) a semiconducting metal oxide doped with thermal catalyst by sol gel processing, or (iv) a semiconducting metal oxide doped with thermal catalyst by wet impregnation;

B) an adhesion agent such as calcium oxide or calcium hydroxide or polyvinyl alcohol and/or a flocculating agent such as polyacrylamide or polyacrylic acid and a solvent, and C) at least one binder c) adding from more than 0 up to 20 wt %, based on the weight of the metal oxide, of a thermal catalyst to the colloid of step b) either (i) as a separate material or (ii) by doping the semiconductor metal oxide by sol gel processing or (iii) by doping the semiconductor metal oxide by wet impregnation;

d) pre-treating the electro-conducting substrate of step a) with a metal oxide precursor such as $TiCl_4$ or titanium isopropoxide to aid adhesion e) applying the composition of step c) to the conducting side of the first electrode;

f) heating the coated electrode to a temperature of at most 300° C. for sintering the metal oxide(s);

g) post-treating the metal oxide film with a metal oxide precursor such as $TiCl_4$ or titanium isopropoxide and sintering again to a temperature of at most 300° C. to improve the open circuit voltage $V_{oc}$ thereby improving cell efficiency.

h) providing a second electrode, the counter-electrode, prepared from a transparent substrate coated with a transparent conducting oxide and additionally coated with platinum or carbon;

i) optionally pre-dyeing the first electrode coated with metal oxide of step e) with a solution comprising one or more dyes in order to covalently bind said dye(s) to the surface of the metal oxide;

j) piercing at least two perforations in the first and/or second electrodes and sealing said electrodes together with glue or with a thermoplastic polymer;

k) pumping one or more solution(s) comprising the same one or more dyes as those of the pre-dyeing step along with cosorbents through the holes in the electrodes in order to covalently bind said dye(s) to the surface of the metal oxide wherein dyeing is carried out between the sealed electrodes at a temperature of from 10° C. to 70° C.;

l) injecting an electrolyte through the holes in the electrodes either simultaneously with the dye(s) or not more than 10 minutes after the dye;

m) sealing the holes in the electrodes with glue or with a thermoplastic polymer;

n) providing an external connection between the two electrodes for electron transport.

The solar cells of the present invention have an efficiency of at least 4%, preferably of at least 4.5%.

Solar panels can then be prepared by connecting individual solar cells prepared according to the present invention.

EXAMPLES

Comparative Examples

Sandwich-type DSC cells devices were prepared following the structure described in FIG. 1. The working photoelectrode was prepared on fluorine tin oxide (FTO)-coated glass with resistance of 15 Ω/cm² by doctor blading a colloidal paste of titania using a spacer of 1 layer of Scotch® tape to create a thin film of titania having a thickness of approximately 7 μm with a working area of 1.0 cm².

Colloidal pastes were prepared by mixing metal oxide (1.6 g of titania) with terpineol (350 wt %, based on the weight of the metal oxide), ethanol (75 wt % based on the weight of the metal oxide) and water (35 wt % based on the weight of the metal oxide) and ethyl cellulose binder (32 wt % based on the weight of metal oxide). The mixture was heated to a temperature of about 60° C. and stirred for 48 hours, cooled to room temperature and homogenised at 8000 rpm for 25 minutes followed by sonication for 30 minutes. Ethanol and water were removed by heating at 45-50° C. for 48 h with stirring.

Once the colloid was applied to the FTO substrate, it was allowed to dry prior to sintering. Comparative samples were heated to a temperature of 450° C. for 30 minutes and cooled to about 100° C. Prior to dyeing, some samples were also dipped in a 50 mM $TiCl_4$:THF solution at a temperature of 70° C. for 30 minutes and, after rinsing with water and ethanol films, these were sintered again at 450° C. for 30 minutes and cooled to about 100° C.

The resultant metal oxide films were dipped into ethanolic dye solution containing the di-ammonium salt of cis-bis(4,4'-dicarboxy-2,2'-bipyridine)dithiocyanato ruthenium(II), commonly known as N719 (1 mM) for time periods of 16-18 hours. After dyeing, a thermoplastic polymer gasket (Surlyn® from Du Pont) was placed around the photoelectrode and a second transparent-conducting glass coated electrode with a platinum layer, the counter electrode, was placed on top and the electrodes sealed together at a temperature of 120° C. A commercial liquid electrolyte containing iodine/tri-iodide in nitrile solvent (Dyesol Ltd, Australia) was added through a hole in the counter electrode which was then sealed using thermoplastic polymer Surlyn® from Du Pont). Table 1 displays typical efficiency data and fill factors along with the open circuit voltage or voltage at zero current $V_{oc}$ and the short circuit current or current at zero voltage $J_{sc}$ for comparative cells (1.0 cm²).

TABLE 1

| Metal oxide | Sintering temperature (° C.) | $TiCl_4$ post-treatment | $V_{oc}$ (V) | $J_{sc}$ (mA cm$^{-2}$) | Fill factor (%) | Efficiency (%) |
|---|---|---|---|---|---|---|
| Titania | 450 | Yes | 0.75 | 11.3 | 0.56 | 4.73 |
|  | 290 | Yes | 0.58 | 1.0 | 0.68 | 0.40 |

Examples According to the Invention

Sandwich-type DSC cells devices were prepared following the structure described in FIG. 1. The working photoelectrode was prepared on fluorine tin oxide-coated glass with resistance of 150/cm² by doctor blading a colloidal paste of titania using a spacer of 1 layer of Scotch® tape to create a thin film of titania having a thickness of approximately 7 μm, with a working area of 1.0 cm².

Colloidal pastes were prepared by mixing a combination of metal oxide titania and thermal catalyst having a total mass of 1.6 g with terpineol (350 wt %, based on the weight of the metal oxide), ethanol (75 wt % based on the weight of the metal oxide) and water (35 wt % based on the weight of the metal oxide) and ethyl cellulose binder (32 wt % based on the weight of metal oxide). The mixture was heated to about 60° C. and stirred for 48 hours, cooled to room temperature and homogenised at 8000 rpm for 25 minutes followed by sonication for 30 minutes. Ethanol and water were removed by heating at 45-50° C. for 48 hours with stirring.

Once the colloid was applied to the FTO substrate, it was allowed to dry prior to sintering. Comparative samples were heated to 450° C. for 30 minutes and cooled to about 100° C. ready for dyeing. Prior to dyeing, some samples were also dipped in a 50 mM $TiCl_4$:THF solution at 70° C. for 30 minutes and, after rinsing with water and ethanol films, these were sintered again at 450° C. for 30 minutes and cooled to about 100° C. ready for dyeing.

The resultant metal oxide films were dipped into ethanolic dye solution containing the di-ammonium salt of cis-bis(4,4'-dicarboxy-2,2'-bipyridine)dithiocyanato ruthenium(II), commonly known as N719 (1 mM) for time periods of 16-18 hours. After dyeing, a thermoplastic polymer gasket (Surlyn® from Du Pont) was placed around the photoelectrode and a second transparent-conducting glass coated electrode with a platinum layer, the counter electrode, was placed on top and the electrodes sealed together at a temperature of 120° C. A commercial liquid electrolyte containing iodine/tri-iodide in nitrile solvent (Dyesol Ltd, Australia) was added through a hole in the counter electrode which was then sealed using thermoplastic polymer (Surlyn® from Du Pont). Table 1 displays typical efficiency data and fill factors for comparative cells (1.0 cm$^2$).

Example 1

The working photoelectrode was prepared on fluorine tin oxide-coated glass with resistance of 15 Ω cm$^{-2}$ by doctor blading a colloidal paste of titania containing 10% ceria as a thermal catalyst using a spacer of 1 layer of Scotch® tape followed by sintered at 290° C. for 30 minutes giving a metal oxide film of approximately 7 μm thickness. The resulting device gave a cell efficiency of 4.3%, $V_{oc}$ of 0.82 V, $J_{sc}$ of 9.6 mA cm$^{-2}$ and a fill factor of 0.55.

Example 2

The working photoelectrode was prepared on fluorine tin oxide-coated glass with resistance of 15 Ω cm$^{-2}$ by doctor blading a colloidal paste of titania containing 10% ceria as a thermal catalyst using a spacer of 1 layer of Scotch® tape followed by sintered at 290° C. for 30 minutes giving a metal oxide film of approximately 7 μm thickness. The metal oxide film was then treated with a 50 mM TiCl$_4$:THF solution at 70° C. for 30 minutes and re-sintered at 290° C. for 30 minutes. The resulting device gave a cell efficiency of 4.6° A), $V_{oc}$ of 0.75 V, $J_{sc}$ of 11.5 mA cm$^{-2}$ and a fill factor of 0.53.

The invention claimed is:

1. A method for low temperature sintering of metal oxide paste coating the electrode of dye-sensitised solar cells, said method comprising the steps of:
   a) providing an electrode;
   b) preparing a colloid comprising a metal oxide, a solvent and a binder;
   c) adding from more than 0 up to 20 wt %, based on the weight of the metal oxide, of a thermal catalyst to the colloid of step b);
   d) optionally pre-treating the electrode of step a) with a metal oxide precursor;
   e) applying the colloid of step c) to the optionally pre-treated electrode;
   f) heating the coated electrode to a temperature of at most 300° C. for sintering the metal oxide followed by cooling to a temperature of about 100° C.;
   g) optionally post-treating the metal oxide film of step f) with a metal oxide precursor and sintering again at a temperature of at most 300° C. followed by cooling to a temperature of about 100° C.; and
   h) retrieving the electrode coated with sintered metal oxide.

2. The method of claim 1, wherein the binder is selected from the group consisting of polyethylene glycol, polyvinyl alcohol, and ethyl cellulose.

3. The method of claim 1, wherein the binder is in an amount of from 20 to 40 wt % with respect to the weight of the metal oxide.

4. The method of claim 1, wherein the thermal catalyst is incorporated into the metal oxide by sol gel methods.

5. The method of claim 1, wherein the thermal catalyst is incorporated into the metal oxide during its synthesis by wet impregnation.

6. The method of claim 1, wherein the thermal catalyst is a metal oxide different from that used for coating the electrode.

7. The method of claim 6, wherein the thermal catalyst is selected from the group consisting of manganese oxide, vanadium oxide, niobium oxide, barium oxide, and cerium oxide.

8. The method of claim 1, wherein the thermal catalyst is present in an amount of about 10 wt %, based on the weight of the metal oxide.

9. The method of claim 1, wherein at least one of an adhesion agent and a flocculating agent is added to aid the adhesion of titania particles to each other within the film and to the electro-conducting substrate.

10. The method of claim 9, wherein the adhesion agent is selected from the group consisting of calcium oxide, calcium hydroxide, and polyvinyl alcohol.

11. The method of claim 9, wherein the flocculating agent is selected from polyacrylamide or polyacrylic acid.

12. The method of claim 1, wherein the coated electrode is obtained by the method of screen printing or doctor blading onto the substrate.

13. The method of claim 1, wherein the process of sintering at up to 300° C. is replaced by a two step process of sintering at a temperature of up to 200° C. followed by exposure to ultra-violet radiation or inversely by exposure to ultra-violet radiation followed by sintering at a temperature of up to 200° C.

14. The method of claim 1, wherein the process of sintering at up to 300° C. is replaced by a two step process of sintering at a temperature of up to 300° C. followed by exposure to microwave radiation or inversely by exposure to microwave radiation followed by sintering at a temperature of up to 300° C.

15. The method of claim 1, wherein the colloid further comprises an adhesion agent.

16. The method of claim 1, wherein the method comprises the pre-treating step d).

17. The method of claim 16, wherein the metal oxide precursor of the pre-treating step d) is selected from TiCl$_4$ or titanium isopropoxide.

18. The method of claim 1, wherein the method comprises the post-treating step g).

19. The method of claim 18, wherein the metal oxide precursor of the post-treating step g) is selected from TiCl$_4$ or titanium isopropoxide.

20. The method of claim 1 wherein the binder is ethyl cellulose.

21. A process for preparing dye sensitised solar cells, including low temperature sintering, said process comprising the steps of:
   a) providing a first electrode prepared from an electro-conducting substrate;
   b) preparing a colloid comprising:
      at least one semiconducting metal oxide selected from titanium dioxide or zinc oxide, or at least one semi-conducting metal oxide and a thermal catalyst, or a semiconducting metal oxide doped with thermal catalyst by sol gel processing, or a semiconducting metal oxide doped with thermal catalyst by wet impregnation;

optionally at least one of an adhesion agent and a flocculating agent and a solvent; and at least one binder;

c) adding from more than 0 up to 20 wt %, based on the weight of the metal oxide, of a thermal catalyst to the colloid of step b) as a separate material or by doping the semiconductor metal oxide by sol gel processing or by doping the semiconductor metal oxide by wet impregnation;

d) pre-treating the electro-conducting substrate of step a) with a metal oxide precursor to aid adhesion;

e) applying the colloid of step c) to the conducting side of the first electrode;

f) heating the coated electrode to a temperature of at most 300° C. for sintering the metal oxide(s);

g) post-treating the metal oxide film with a metal oxide precursor and sintering again to a temperature of at most 300° C. to improve the open circuit voltage $V_{oc}$ thereby improving cell efficiency;

h) providing a second electrode, which is the counter-electrode, prepared from a transparent substrate coated with a transparent conducting oxide and additionally coated with platinum or carbon;

i) optionally pre-dyeing the first electrode coated with metal oxide of step e) with a solution comprising one or more dyes in order to covalently bind said dye(s) to the surface of the metal oxide;

j) piercing at least two perforations in at least one of the first and second electrodes and sealing said electrodes together with glue or with a thermoplastic polymer;

k) pumping one or more solution(s) comprising the same one or more dyes as those of the pre-dyeing step along with cosorbents through the holes in the electrodes in order to covalently bind said dye(s) to the surface of the metal oxide and wherein dyeing is carried out between the sealed electrodes at a temperature of from 10° C. to 70° C.;

l) injecting an electrolyte through the holes in the electrodes wherein said electrolyte is added simultaneously with the dye or not more than 10 minutes after the dye;

m) sealing the holes in the electrodes with glue or with a thermoplastic polymer; and n) providing an external connection between the two electrodes for electron transport.

22. The process of claim 21, wherein the colloid comprises the adhesion agent and the adhesion agent is selected from the group consisting of calcium oxide, calcium hydroxide, and polyvinyl alcohol.

23. The process of claim 21, wherein the colloid comprises the flocculating agent and the flocculating agent is selected from polyacrylamide or polyacrylic acid.

24. The process of claim 21, wherein the metal oxide precursor of the pre-treating step d) is selected from $TiCl_4$ or titanium isopropoxide.

25. The process of claim 21, wherein the metal oxide precursor of the post-treating step g) is selected from $TiCl_4$ or titanium isopropoxide.

26. The process of claim 21, wherein the method comprises the pre-dyeing step i).

* * * * *